(12) United States Patent
Kang

(10) Patent No.: US 9,206,960 B2
(45) Date of Patent: Dec. 8, 2015

(54) ORGANIC LIGHT-EMITTING DISPLAY DEVICE AND METHOD OF MANUFACTURING THE SAME

(71) Applicant: Taek-Kyo Kang, Yongin (KR)

(72) Inventor: Taek-Kyo Kang, Yongin (KR)

(73) Assignee: SAMSUNG DISPLAY CO., LTD., Yonggin, Gyunggi-Do (KR)

( * ) Notice: Subject to any disclaimer, the term of this patent is extended or adjusted under 35 U.S.C. 154(b) by 175 days.

(21) Appl. No.: 13/682,987

(22) Filed: Nov. 21, 2012

(65) Prior Publication Data

US 2014/0028176 A1 Jan. 30, 2014

(30) Foreign Application Priority Data

Jul. 25, 2012 (KR) .................. 10-2012-0081406

(51) Int. Cl.
| | |
|---|---|
| *H01J 1/62* | (2006.01) |
| *H01J 63/04* | (2006.01) |
| *F21V 13/10* | (2006.01) |
| *F21V 11/00* | (2015.01) |
| *H01J 9/20* | (2006.01) |
| *H01L 51/52* | (2006.01) |
| *H01L 27/32* | (2006.01) |

(52) U.S. Cl.
CPC ............ *F21V 13/10* (2013.01); *F21V 11/00* (2013.01); *H01J 9/205* (2013.01); *H01L 51/5271* (2013.01); *H01L 51/5284* (2013.01); *H01L 27/3211* (2013.01)

(58) Field of Classification Search
CPC .......... F21V 13/10; F21V 11/00; H01J 9/205; H01L 51/5271; H01L 51/5284; H01L 27/3211
USPC ............. 313/498–512, 113; 445/23–25
See application file for complete search history.

(56) References Cited

U.S. PATENT DOCUMENTS

| | | | | |
|---|---|---|---|---|
| 6,768,534 B2* | 7/2004 | Iwase et al. | ............ | 349/153 |
| 2004/0069017 A1* | 4/2004 | Li et al. | ............ | 65/43 |
| 2004/0245529 A1* | 12/2004 | Yamazaki et al. | ............ | 257/79 |
| 2005/0258744 A1* | 11/2005 | Kwak et al. | ............ | 313/504 |
| 2007/0152579 A1* | 7/2007 | Takemoto et al. | ............ | 313/512 |
| 2007/0176553 A1* | 8/2007 | Kwak | ............ | 313/512 |
| 2007/0176554 A1* | 8/2007 | Kwak | ............ | 313/512 |
| 2008/0278063 A1* | 11/2008 | Cok | ............ | 313/500 |
| 2009/0134787 A1* | 5/2009 | Matsuo | ............ | 313/504 |
| 2011/0204771 A1* | 8/2011 | Lee et al. | ............ | 313/504 |

FOREIGN PATENT DOCUMENTS

| | | |
|---|---|---|
| JP | 2000-302487 A | 10/2000 |
| JP | 2003-203760 A | 7/2003 |
| JP | 2012-015023 | 1/2012 |

* cited by examiner

*Primary Examiner* — Thomas A Hollweg
*Assistant Examiner* — Kevin Quarterman
(74) *Attorney, Agent, or Firm* — Lee & Morse, P.C.

(57) ABSTRACT

An organic light-emitting display device includes a first substrate and a second substrate that face each other, a pixel between the first substrate and the second substrate and the pixel emitting primary light toward one of the first and second substrates, and a black film arranged on another of the first and second substrates. The other of the first and second substrates being opposite to the one of the first and second substrates toward which the primary light is emitted.

17 Claims, 4 Drawing Sheets

ORGANIC LIGHT-EMITTING DISPLAY DEVICE AND METHOD OF MANUFACTURING THE SAME

CROSS-REFERENCE TO RELATED APPLICATION

This application claims priority under 35 U.S.C. §119 to Korean Patent Application No. 10-2012-0081406, filed on Jul. 25, 2012, in the Korean Intellectual Property Office, which is incorporated herein in its entirety by reference.

BACKGROUND

An organic light-emitting display device may has a stacked structure including a pixel electrode that is an anode, a counter electrode that is a cathode, and a light-emitting layer that is arranged between the pixel electrode and the counter electrode. The light-emitting layer may display a color image based on the principle that light is emitted as holes and electrons injected from the anode and the cathode recombine in the light-emitting layer.

SUMMARY

Embodiments may be realized by an organic light-emitting display device that includes a first substrate and a second substrate that face each other, a pixel that is formed between the first substrate and the second substrate and emits light, and a black film that is disposed on a substrate opposite to a substrate toward which light generated by the pixel is emitted from among the first substrate and the second substrate.

The pixel may include a plurality of sub-pixels that emit light of different colors. The plurality of sub-pixels may include red, green, and blue sub-pixels.

Each of the plurality of sub-pixels may include an anode that is adjacent to the first substrate, a cathode that is adjacent to the second substrate, and a light-emitting unit that is disposed between the anode and the cathode. Light generated by the light-emitting unit may be emitted toward the second substrate.

The organic light-emitting display device may further include a reflective film that is disposed on the substrate on which the black film is disposed from among the first substrate and the second substrate.

Embodiments may also be realized by a method of manufacturing an organic light-emitting display device that includes forming a pixel on a first substrate, providing a second substrate over the first substrate to cover the pixel, and disposing a black film on a substrate opposite to a substrate toward which light generated by the pixel is emitted from among the first substrate and the second substrate.

The pixel may include a plurality of sub-pixels that emit light of different colors. The plurality of sub-pixels may include red, green, and blue sub-pixels. Each of the plurality of sub-pixels may include an anode that is adjacent to the first substrate, a cathode that is adjacent to the second substrate, and a light-emitting unit that is disposed between the anode and the cathode. Light generated by the light-emitting unit may be emitted toward the second substrate.

The method may further include disposing a reflective film on the substrate on which the black film is disposed from among the first substrate and the second substrate.

BRIEF DESCRIPTION OF THE DRAWINGS

Features will become apparent to those of ordinary skill in the art by describing in detail exemplary embodiments thereof with reference to the attached drawings in which.

DETAILED DESCRIPTION

Figure 1:
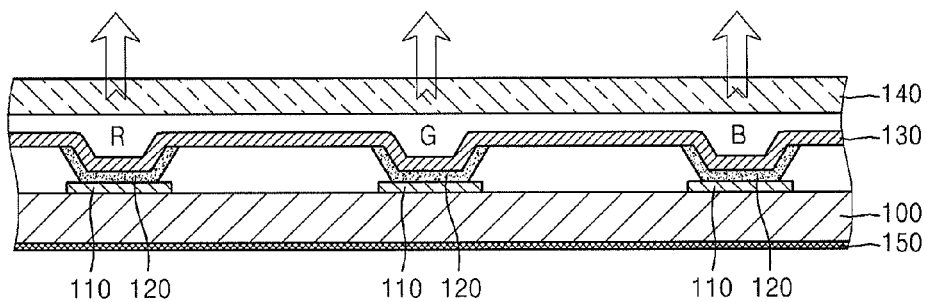
FIG. 1 is a cross-sectional view illustrating an organic light-emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

FIG. 1 is a cross-sectional view illustrating three color, that is, red (R), green (G), and blue (B), sub-pixels R, G, and B constituting each of a plurality of unit pixels of an organic light-emitting display device according to an embodiment of the present invention. In the organic light-emitting display device, the unit pixels each including the three color sub-pixels R, G, and B are repeatedly arranged in rows and columns.

Referring to FIG. 1, first and second electrodes 110 and 130, which face each other, are disposed on a first substrate 100. A light-emitting unit 120 is disposed between the first and second electrodes 110 and 130. Accordingly, when an appropriate voltage is formed between the first and second electrodes 110 and 130, the light-emitting unit 120 emits light and displays a color image. The light emitted by the light-emitting unit 120 for displaying the color image is primary light, which primary light may be emitted toward one of the first substrate 100 or a second substrate 140 that opposes the first substrate 100. Secondary light may be leakage light that is emitting in other directions.

A second substrate 140 that reduces the possibility of and/or prevents penetration of external moisture or oxygen is provided on the sub-pixels R, G, and B. The second substrate 140 is attached to the first substrate 100 with a sealant (not shown) therebetween.

According to an exemplary embodiment, light generated by each of the sub-pixels R, G, and B may emitted toward the second substrate 140. That is, light generated by the light-emitting unit 120 of each of the sub-pixels R, G, and B passes through the second electrode 130 and the second substrate 140, and is emitted to the outside.

In order to improve light extraction efficiency to the second substrate 140, toward which light is emitted, light generated by the light-emitting unit 120 of each of the sub-pixels R, G, and B should not leak toward the first substrate 100, which is opposite to the second substrate 140. Accordingly, a black film 150 for blocking light leakage is attached to an outer surface of the first substrate 100. That is, the black film 150 functions as a light-shielding member to reduce the possibility of and/or prevent light, e.g., secondary light, generated by the light-emitting unit 120 of each of the sub-pixels R, G, and B from leaking in the direction of the first substrate 100. For example, the black film 150 may reduce the possibility of and/or prevent secondary light from leaking in the direction of the first substrate 100.

Accordingly, since light generated by the light-emitting unit 120 is desirably emitted toward the second substrate 140, light extraction efficiency may be improved.

The first electrode 110 may act as an anode and the second electrode 130 may act as a cathode. The organic light-emitting display device of FIG. 1 may be a top emission organic light-emitting display device in which light is emitted toward the second electrode 130 acting as a cathode.

The organic light-emitting display device of FIG. 1 may be manufactured as follows.

Figure 2A:
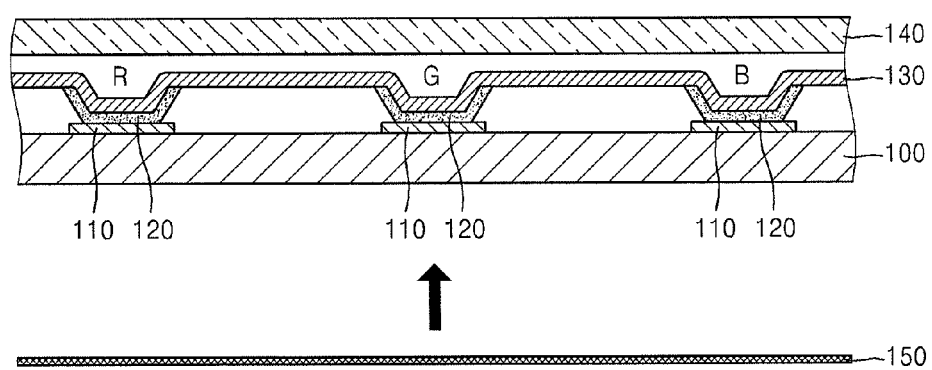
FIGS. 2A and 2B are cross-sectional views depicting stages in methods of manufacturing the organic light-emitting display device of FIG. 1.
Figure 2B:
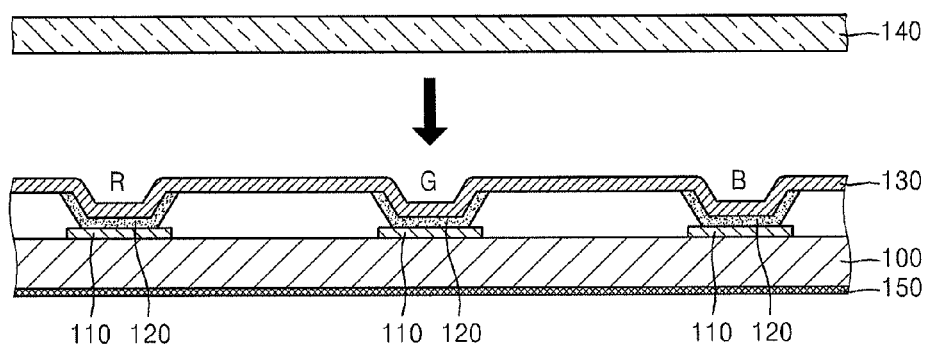

FIGS. 2A and 2B are cross-sectional views for explaining exemplary methods of manufacturing the organic light-emitting display device of FIG. 1.

Referring to FIG. 2A, the first electrode 110, the light-emitting unit 120, and the second electrode 130 of each of the three color sub-pixels R, G, and B are formed on the first substrate 100, the second substrate 140 is provided over the first substrate 100 to cover the first substrate 100, and the first substrate 100 and the second substrate 140 are sealed.

Next, the black film 150 is attached to the outer surface of the first substrate 100 to form a light-shielding film. Accordingly, light extraction efficiency of the organic light-emitting display device may be improved simply and effectively. Accordingly, a more reliable product may be obtained by using the organic light-emitting display device.

In FIG. 2A, the first and second substrates 100 and 140 are attached to each other and then the black film 150 is attached to the first substrate 100. However, as shown in FIG. 2B, the black film 150 may be attached to the first substrate 100, the first electrode 110, the light-emitting unit 120, and the second electrode 130 of the three color sub-pixels R, G, and B may be formed, and then the second substrate 140 may be attached.

Figure 3:
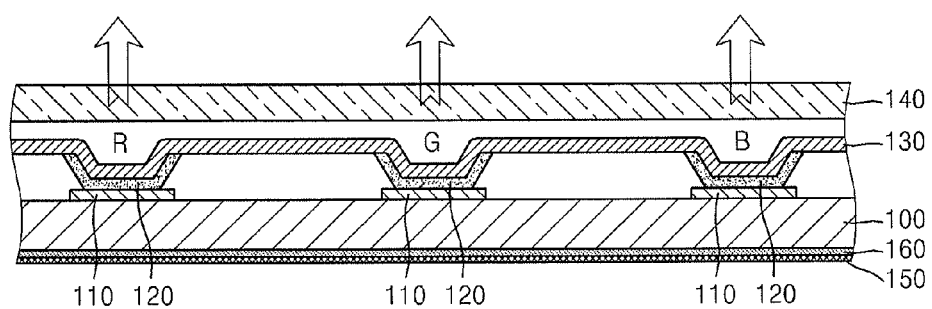
FIG. 3 is a cross-sectional view illustrating an organic light-emitting display device according to an exemplary embodiment.

FIG. 3 is a cross-sectional view illustrating an organic light-emitting display device according to another embodiment. In FIG. 1 only the black film 150 is attached as a light-shielding member, in FIG. 3 a reflective film 160 is attached along with the black film 150. For example, the reflective film 160 is first attached to the outer surface of the first substrate 100 that is opposite to a substrate toward which light is emitted, and then the black film 150 is attached to the reflective film 160. Accordingly, since the black film 150 may reduce the possibility of and/or prevent light, e.g., secondary light, from leaking out and the reflective film 160 reflects light, if anything, leaking toward the first substrate 100 to the second substrate 140, light extraction efficiency to the second substrate 140 may be further improved.

The organic light-emitting display device of FIG. 3 may be manufactured as follows.

Figure 4A:
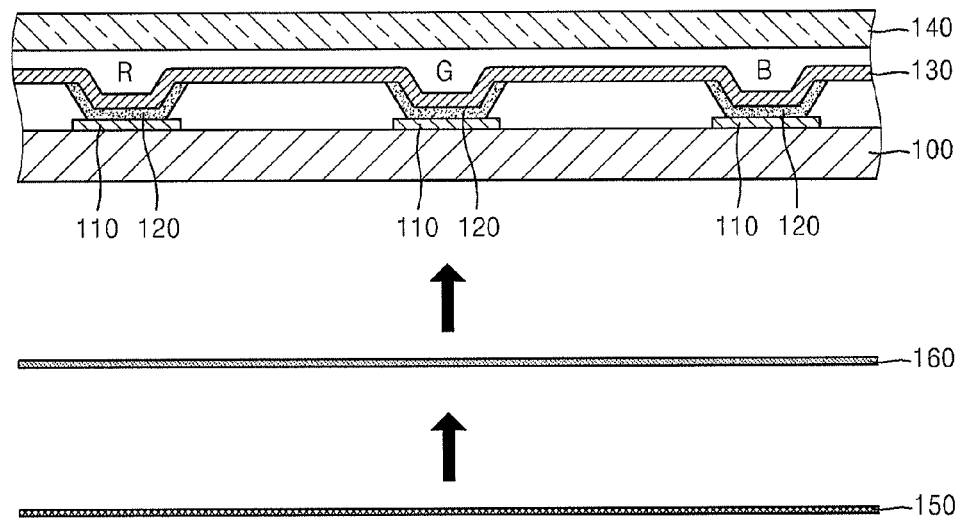
FIGS. 4A and 4B are cross-sectional views depicting stages in methods of manufacturing the organic light-emitting display device of FIG. 3.
Figure 4B:
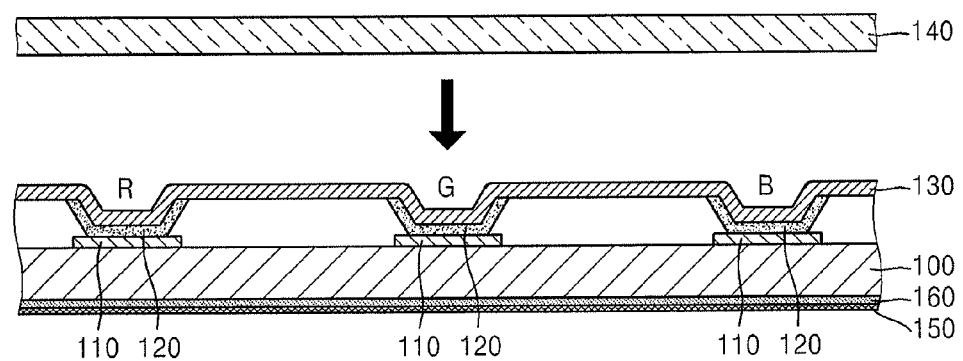

FIGS. 4A and 4B are cross-sectional views for explaining exemplary methods of manufacturing the organic light-emitting display device of FIG. 3.

Referring to FIG. 4A, the first electrode 110, the light-emitting unit 120, and the second electrode 130 of the three color sub-pixels R, G, and B are formed on the first substrate 100, the second substrate 140 is provided over the first substrate 100 to cover the first substrate 100, and the first substrate 100 and the second substrate 140 are sealed.

Next, the reflective film 160 and the black film 150 are sequentially attached to the outer surface of the first substrate 100 to form a light-shielding and reflecting film.

Accordingly, light extraction efficiency of the organic light-emitting display device may be improved simply and effectively. Accordingly, a more reliable product may be obtained by using the organic light-emitting display device.

In FIG. 4A, the first and second substrates 100 and 140 are attached to each other and then the reflective film 160 and the black film 150 are attached to the first substrate 100. For example, the reflective film 160 and the black film 150 may be respectively attached to the first substrate 100. Alternatively, the reflective film 160 and the black film 150 may be first attached to each other, and then the reflective film 160, having the black film 150 attached thereto, may be attached to the first substrate 100.

As shown in FIG. 4B, the reflective film 160 and the black film 150 may be attached to the first substrate 100, the first electrode 110, the light-emitting unit 120, and the second electrode 130 of the three color sub-pixels R, G, and B may be formed, and then the second substrate 140 may be attached.

Accordingly, since light extraction efficiency may be effectively improved by using the organic light-emitting display device, a more reliable product may be obtained.

Figure 5:
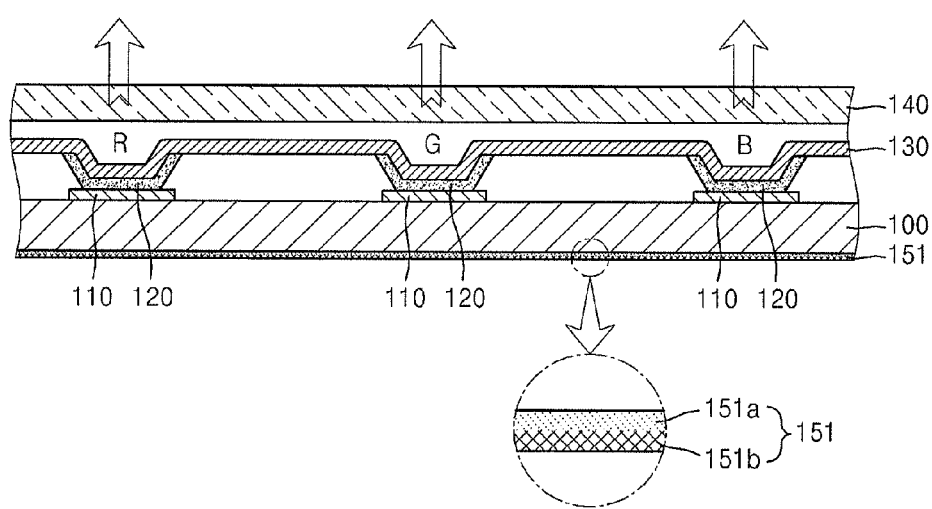
FIG. 5 is a cross-sectional view illustrating an organic light-emitting display device according to an exemplary embodiment.

Since the reflective film 160 and the black film 150 are separately prepared and attached in FIG. 3, there is a limitation in reducing a size of a product. Therefore, according to another exemplary embodiment, a black film 151 having one surface on which a reflective layer 151a is integrally formed may be used as shown in FIG. 5. When the black film 151 having one surface on which the reflective layer 151a is formed and another opposing surface on which a black layer 151b is formed is used, light extraction efficiency may be improved like in FIG. 3 and a product may be made slim.

By way of summation and review, each of a plurality of unit pixels of the organic light-emitting display device may include red (R), green (G), and blue (B) sub-pixels, and a desired color image is displayed by combining the R, G, and B sub-pixels. That is, in each of the R, G, and B sub-pixels, a light-emitting unit for emitting R, G, or B light is disposed between two electrodes, and a color image of the unit pixel is displayed by appropriately combining the R, G, and B lights.

However, there is a gap between the R, G, and B sub-pixels and light may leak through the gap in a direction opposite to a direction in which the light, e.g., primary light, is desired to be emitted. For example, if the organic light-emitting display device is a top emission organic light-emitting display device in which light is emitted toward the counter electrode, light generated by the light-emitting unit is not all emitted to the counter electrode and part of the light leaks toward the pixel electrode through the gap between the R, G, and B sub-pixels. Accordingly, light extraction efficiency may be reduced, image quality such as luminance may be degraded.

In contrast, embodiments relate to a display device that may effectively improve light extraction efficiency and a method of manufacturing the same. Embodiments also relate to an organic light-emitting display device that may improve light extraction efficiency and a method of manufacturing the organic light-emitting display device. As described above, the display device and the method of manufacturing the same may effectively improve light extraction efficiency, and a more reliable product may be obtained by using the organic light-emitting display device and the method.

Exemplary embodiments have been disclosed herein, and although specific terms are employed, they are used and are to be interpreted in a generic and descriptive sense only, and for the purpose of illustration and not limitation. Accordingly, it will be understood by those of ordinary skill in the art that various changes in form and details may be made without departing from the spirit and scope of the present invention as set forth in the following claims.

What is claimed is:

1. An organic light-emitting display device, comprising:
   a first substrate and a second substrate that face each other;
   a pixel between the first substrate and the second substrate, the pixel including an anode that is directly on the first substrate and a light-emitting unit that is directly on the anode, the light-emitting unit of the pixel emitting primary light toward the second substrate; and
   a black film arranged on an outer surface of the first substrate, the first substrate being opposite to the second substrate, the black film being an outermost layer of the organic light-emitting display device.

2. The organic light-emitting display device of claim 1, wherein the pixel includes a plurality of sub-pixels that emit primary light of different colors.

3. The organic light-emitting display device of claim 2, wherein the plurality of sub-pixels include red, green, and blue sub-pixels.

4. The organic light-emitting display device of claim 3, wherein
   each of the plurality of sub-pixels includes an anode that is adjacent to the first substrate, a cathode that is adjacent to the second substrate, and a light-emitting unit that is between the anode and the cathode.

5. The organic light-emitting display device of claim 1, further comprising a reflective film that is arranged on the first substrate.

6. The organic light-emitting display device of claim 1, wherein the black film has one surface having a reflective layer and another surface having a black layer.

7. The organic light-emitting display device of claim 5, wherein:
   the reflective film is arranged on the outer surface of the first substrate; and
   the black film is arranged on an outer surface of the reflective film.

8. The organic light-emitting display device of claim 6, wherein the surface having a reflective layer is arranged on the outer surface of the first substrate.

9. A method of manufacturing an organic light-emitting display device, the method comprising:
   forming a pixel on a first substrate, the pixel including an anode that is directly on the first substrate and a light-emitting unit that is directly on the anode;
   providing a second substrate over the first substrate to cover the pixel such that the light-emitting unit of the pixel emits primary light toward the second substrate; and
   disposing a black film on an outer surface of the first substrate, the first substrate being opposite to the second substrate, the black film being an outermost layer of the organic light-emitting display device.

10. The method of claim 9, wherein forming the pixel includes forming a plurality of sub-pixels that emit primary light of different colors.

11. The method of claim 10, wherein the plurality of sub-pixels includes red, green, and blue sub-pixels.

12. The method of claim 11, wherein
   forming each of the plurality of sub-pixels includes forming an anode that is adjacent to the first substrate, forming a cathode that is adjacent to the second substrate, and forming a light-emitting unit that is disposed between the anode and the cathode.

13. The method of claim 9, further comprising disposing a reflective film on the first substrate.

14. The method of claim 9, wherein the black film has one surface including a reflective layer and another surface including a black layer.

15. The method of claim 13, comprising:
   disposing the reflective film on the outer surface of the first substrate; and
   disposing the black film on an outer surface of the reflective film.

16. The method of claim 14, comprising disposing the surface including the reflective layer on the outer surface of the first substrate.

17. An organic light-emitting display device, comprising:
   a first substrate and a second substrate that face each other;
   a pixel between the first substrate and the second substrate, the pixel including an anode that is directly on the first substrate and a light-emitting unit that is directly on the anode, the light-emitting unit of the pixel emitting primary light toward the second substrate; and
   a continuous black film arranged on an entirety of the first substrate, the first substrate being opposite to the second substrate.

* * * * *